(12) United States Patent
Seo et al.

(10) Patent No.: US 7,868,806 B2
(45) Date of Patent: Jan. 11, 2011

(54) APPARATUS AND METHOD FOR DYNAMIC CIRCUIT ELEMENT SELECTION IN AN DIGITAL-TO-ANALOG CONVERTER

(75) Inventors: Dongwon Seo, San Diego, CA (US); Gene H. McAllister, La Mesa, CA (US); Hayg-Taniel Dabag, Bochum (DE)

(73) Assignee: QUALCOMM Incorporated, San Diego, CA (US)

( * ) Notice: Subject to any disclaimer, the term of this patent is extended or adjusted under 35 U.S.C. 154(b) by 140 days.

(21) Appl. No.: 12/044,399

(22) Filed: Mar. 7, 2008

(65) Prior Publication Data

US 2009/0224953 A1 Sep. 10, 2009

(51) Int. Cl.
*H03M 3/00* (2006.01)
(52) U.S. Cl. .................. 341/144; 341/118
(58) Field of Classification Search .......... 341/144
See application file for complete search history.

(56) References Cited

U.S. PATENT DOCUMENTS

| | | | | |
|---|---|---|---|---|
| 5,406,283 | A * | 4/1995 | Leung | 341/143 |
| 5,856,799 | A * | 1/1999 | Hamasaki et al. | 341/144 |
| 6,348,884 | B1 * | 2/2002 | Steensgaard-Madsen | 341/118 |
| 6,535,155 | B2 * | 3/2003 | Ruha et al. | 341/144 |
| 6,614,377 | B1 * | 9/2003 | Adams et al. | 341/144 |
| 6,778,118 | B2 * | 8/2004 | Heizmann et al. | 341/144 |
| 6,819,276 | B1 * | 11/2004 | Hossack | 341/143 |
| 2002/0008651 | A1 | 1/2002 | Bugeja et al. | |
| 2007/0241950 | A1 | 10/2007 | Petilli et al. | |

FOREIGN PATENT DOCUMENTS

| | | |
|---|---|---|
| EP | 1179889 | 2/2002 |
| WO | 099044289 | 9/1999 |
| WO | 08137752 | 11/2008 |

OTHER PUBLICATIONS

Written Opinion-PCT/US09/036444, International Search Authority Munich-Dec. 10, 2009.
International Search Report-PCT/US09/036444-International Search Authority-EPO-Dec. 10, 2009.
Lee, et al.: "Nyquist-Rate Current-Steering Digital-to-Analog Converters with Random Multiplr Data-Weighted Averaging Technique and QN Rotated Walk Switching Scheme" IEEE Transactions on Circuits and Systems II: Express Briefs, IEEE Service Center, NY NY, US, vol. 53, No. 11, Nov. 1, 2006, pp. 1264-1268.

* cited by examiner

*Primary Examiner*—Khai M Nguyen
(74) *Attorney, Agent, or Firm*—Jiayu Xu

(57) ABSTRACT

According to at least one embodiment of the invention, an apparatus may include first, second and third circuits. The first circuit receives input data and provides a plurality of first signals asserted based on the input data. The second circuit receives the plurality of first signals and provides a plurality of second signals used to select a plurality of circuit elements. The third circuit generates a control for the second circuit using a fractional data weight of the input data, the second circuit mapping the plurality of first signals to the plurality of second signals based on the control from the third circuit.

40 Claims, 13 Drawing Sheets

US 7,868,806 B2

APPARATUS AND METHOD FOR DYNAMIC CIRCUIT ELEMENT SELECTION IN AN DIGITAL-TO-ANALOG CONVERTER

FIELD OF DISCLOSURE

The present disclosure relates generally to electronic circuits, and more specifically to techniques for dynamically selecting circuit elements.

BACKGROUND

Digital-to-analog converters (DACs) are widely used for various applications such as audio, video, data conversion, etc. A DAC receives digital input data and provides an analog output signal. The performance of the DAC may be quantified by various dynamic specifications such as total harmonic distortion (THD), spurious free dynamic range (SFDR), signal-to-noise ratio (SNR), etc.

An N-bit DAC may be implemented with N binary weighted circuit elements, where a circuit element may be a current source, a capacitor, a resistor, etc. With binary weighting, the smallest circuit element has a size of one unit, the next smallest circuit element has a size of two units, and so on, and the largest circuit element has a size of $2^{N-1}$ units. In each sample period, zero or more of the N circuit elements may be selected based on a digital input data value and used to generate an analog output value for that sample period. The performance of the DAC is dependent on the accuracy of the sizes of the N binary weighted circuit elements. Since the size of the largest circuit element is $2^{N-1}$ times the size of the smallest circuit element, it may be difficult to accurately match these circuit elements. Consequently, the performance of the binary-weighted DAC may be relatively poor.

An N-bit DAC may also be implemented with $2^N-1$ circuit elements of equal size. In each sample period, a digital input data value of x may select x circuit elements to generate an analog output value for that sample period. Since all of the circuit elements have the same size, it may be easier to match these circuit elements. Nevertheless, there may be limitations on how closely the $2^N-1$ circuit elements can be matched. Hence, some mismatches typically exist between these circuit elements. To improve performance in the presence of the mismatches, the circuit elements may be selected in a manner such that errors due to the mismatches may be shaped and pushed out of band.

Accordingly, the present disclosure provides techniques to dynamically select circuit elements in order to mitigate deleterious effects due to circuit element mismatches.

SUMMARY

Exemplary embodiments of the invention are directed to systems and method for dynamically selecting circuit elements.

According to an embodiment, an apparatus may include first, second and third circuits. The first circuit receives input data and provides a plurality of first signals asserted based on the input data. The second circuit receives the plurality of first signals and provides a plurality of second signals used to select a plurality of circuit elements. The third circuit generates a control for the second circuit using a fractional data weight of the input data, the second circuit mapping the plurality of first signals to the plurality of second signals based on the control from the third circuit.

According to another embodiment, an integrated circuit may include first, second and third circuits. The first circuit receives input data and provides a plurality of first signals asserted based on the input data. The second circuit receives the plurality of first signals and provides a plurality of second signals used to select a plurality of circuit elements. The third circuit generates a control for the second circuit using a fractional data weight of the input data, the second circuit mapping the plurality of first signals to the plurality of second signals based on the control from the third circuit.

According to another embodiment, a method may include asserting zero or more of a plurality of first signals based on input data, generating a control using a fractional data weight of the input data, mapping the plurality of first signals to a plurality of second signals based on the control, and selecting zero or more of a plurality of circuit elements based on the plurality of second signals.

According to another embodiment, an apparatus may include means for asserting zero or more of a plurality of first signals based on input data, means for generating a control using a fractional data weight of the input data, means for mapping the plurality of first signals to a plurality of second signals based on the control, and means for selecting zero or more of a plurality of circuit elements based on the plurality of second signals.

According to another embodiment, a digital-to-analog converter for converting digital input data to an analog output signal may include a first plurality of circuit elements of equal size, a first thermometer decoder, and a first dynamic element matching (DEM) unit. The first plurality of circuit elements of equal size is used to generate the analog output signal. The first thermometer decoder receives at least a first portion of the digital input data and provides a plurality of first signals. The first DEM unit receives the plurality of first signals and provides a plurality of second signals used to select the first plurality of circuit elements. The first DEM unit maps the plurality of first signals to the plurality of second signals based on a fractional data weight of the at least first portion of the digital input data.

BRIEF DESCRIPTION OF THE DRAWINGS

The accompanying drawings are presented to aid in the description of embodiments of the invention and are provided solely for illustration of the embodiments and not limitation thereof.

DETAILED DESCRIPTION

Aspects of the invention are disclosed in the following description and related drawings directed to specific embodiments of the invention. Alternate embodiments may be devised without departing from the scope of the invention. Additionally, well-known elements of the invention will not be described in detail or will be omitted so as not to obscure the relevant details of the invention.

The word "exemplary" is used herein to mean "serving as an example, instance, or illustration." Any embodiment described herein as "exemplary" is not necessarily to be construed as preferred or advantageous over other embodiments. Likewise, the term "embodiments of the invention" does not require that all embodiments of the invention include the discussed feature, advantage or mode of operation.

The terminology used herein is for the purpose of describing particular embodiments only and is not intended to be limiting of embodiments of the invention. As used herein, the singular forms "a", "an" and "the" are intended to include the plural forms as well, unless the context clearly indicates otherwise. It will be further understood that the terms "comprises", "comprising,", "includes" and/or "including", when used herein, specify the presence of stated features, integers, steps, operations, elements, and/or components, but do not preclude the presence or addition of one or more other features, integers, steps, operations, elements, components, and/or groups thereof.

Further, many embodiments are described in terms of sequences of actions to be performed by, for example, elements of a computing device. It will be recognized that various actions described herein can be performed by specific circuits (e.g., application specific integrated circuits (ASICs)), by program instructions being executed by one or more processors, or by a combination of both. Additionally, these sequence of actions described herein can be considered to be embodied entirely within any form of computer readable storage medium having stored therein a corresponding set of computer instructions that upon execution would cause an associated processor to perform the functionality described herein. Thus, the various aspects of the invention may be embodied in a number of different forms, all of which have been contemplated to be within the scope of the claimed subject matter. In addition, for each of the embodiments described herein, the corresponding form of any such embodiments may be described herein as, for example, "logic configured to" perform the described action.

The dynamic element selection techniques described herein may be used for various circuits such as DACs, sigma-delta ($\Sigma\Delta$) DACs, analog-to-digital converters (ADCs), $\Sigma\Delta$ ADCs, filters, etc. For clarity, the techniques are described below for DACs.

Figure 1:
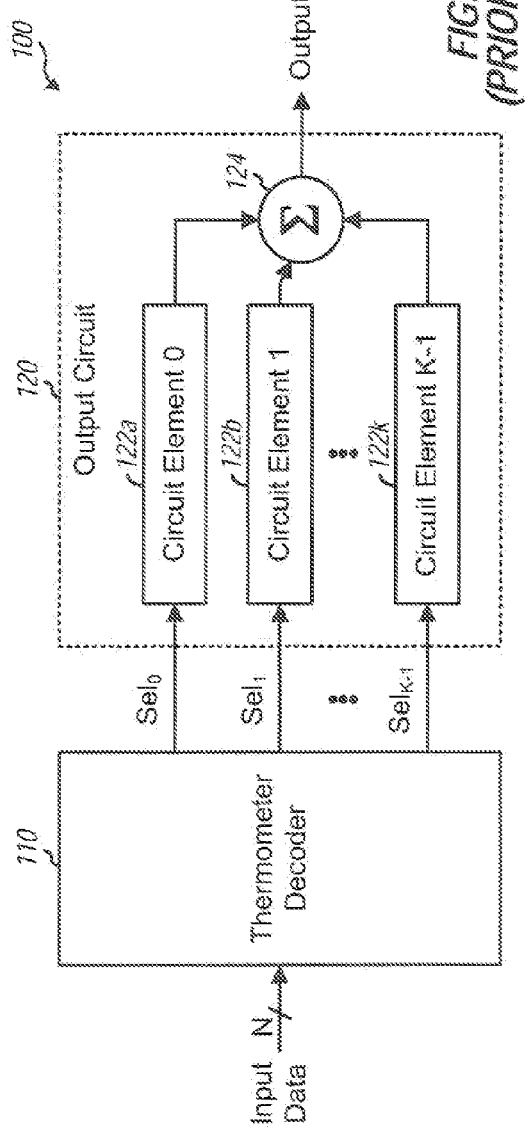
FIG. 1 shows a block diagram of a DAC with thermometer decoding.

FIG. 1 shows a block diagram of a DAC 100 with thermometer decoding. DAC 100 includes a thermometer decoder 110 and an output circuit 120. DAC 100 may also be referred to as a conventional DAC. Decoder 110 receives N-bit input data and provides K select signals $Sel_0$ through $Sel_{K-1}$, where N>1 and $K=2^N$. The terms "signals", "lines", "wires", etc., are often used interchangeably. In each sample period, decoder 110 may receive an input data value of x, assert the first x select signals $Sel_0$ through $Sel_{x-1}$, and de-assert the remaining K−x select signals $Sel_x$ through $Sel_{K-1}$. The number of select signals to assert in each sample period may be dependent on the input data value. Furthermore, the select signals may be asserted in a predetermined order so that the first x select signals are asserted for an input data value of x.

Output circuit 120 includes K circuit elements 122a through 122k that receive the K select signals $Sel_0$ through $Sel_{K-1}$, respectively. Each circuit element 122 may comprise a current source, a switch, a capacitor, a resistor, etc., or any combination thereof. Each circuit element 122 may be enabled when its select signal is asserted and disabled when its select signal is de-asserted. Each circuit element 122, when enabled, provides its output to a summer 124. Summer 124 sums the output of all K circuit elements 122a through 122k and provides an analog output signal.

Because all of the circuit elements 122a through 122k have the same size, it may be easier to match these circuit elements to the input data than for the binary weighted DAC. Nevertheless, there are limitations on how closely the $2^{N-1}$ circuit elements can be matched. Among other factors, circuit elements are subject to various manufacturing non-uniformities, including die thinning and packaging/bump induced mechanical stress, which affects each circuit element to a different degree. Thus, even circuit elements manufactured on the same chip will not be identical to one another, and hence, some mismatches between these circuit elements typically exist. The predetermined selection order of circuit elements with mismatch leads to a correlation between the input data value and the analog output error. The analog output signal of a conventional DAC as in FIG. 1 may therefore have degraded performance, e.g., poor THD.

Figure 2:
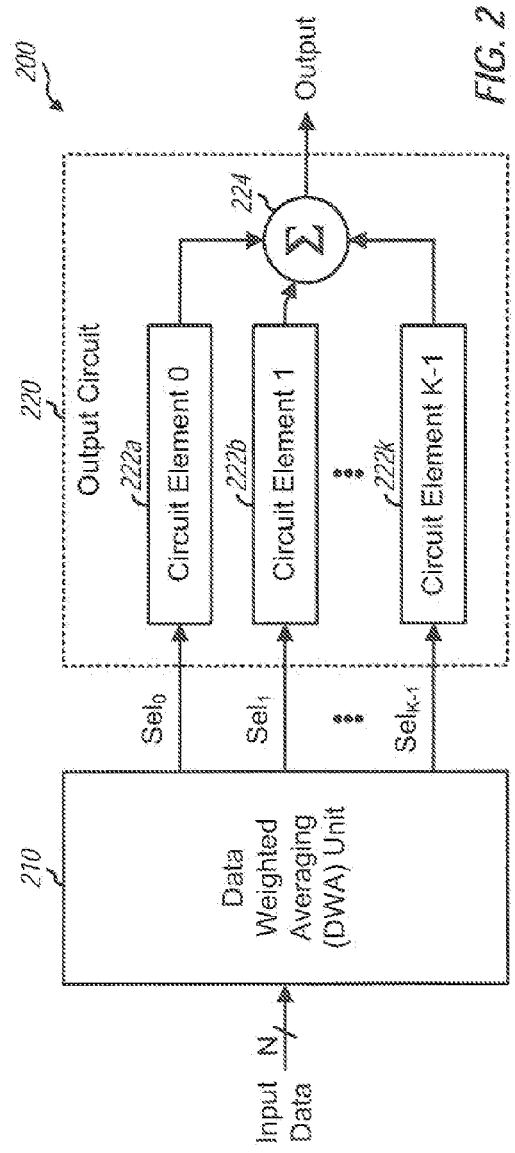
FIG. 2 shows a block diagram of a DAC with data weighted averaging (DWA).

FIG. 2 shows a block diagram of a DAC 200 with data weighted averaging (DWA). For reasons that will become clearer throughout this disclosure, DAC 200 may also be referred to as a full DWA DAC. DAC 200 includes a DWA unit 210 and an output circuit 220. DWA unit 210 receives N-bit input data and provides K select signals $Sel_0$ through $Sel_{K-1}$. In each sample period, DWA unit 210 may receive an input data value of x and assert x of the K select signals. The number of select signals to assert in each sample period may be dependent on the input data value. However, the select signals may be asserted in a different order based on the current input data value as well as the current state of DWA unit 210, as described below. Output circuit 220 includes K circuit elements 222a through 222k and a summer 224. The K circuit elements 222 may be dynamically selected by the K select signals from DWA unit 210.

Figure 3A:
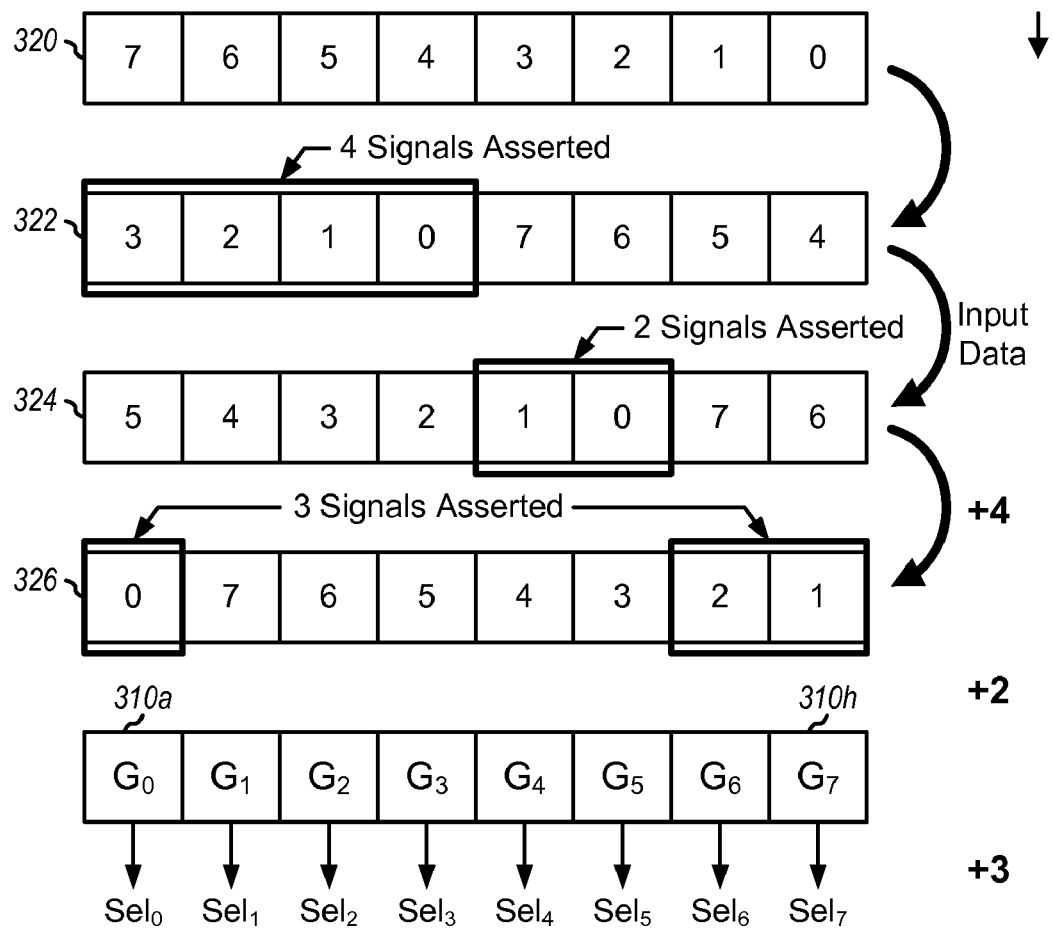
FIG. 3A shows a design of a DWA unit.

FIG. 3A shows a design of DWA unit 210 in FIG. 2 for a case in which N=3 and K=8. In this design, DWA unit 210 includes eight select signal generators 310a through 310h that generate eight select signals $Sel_0$ through $Sel_7$, respectively. Generators 310a through 310h are also referred to as generators $G_0$ through $G_7$, respectively.

Figure 3B:
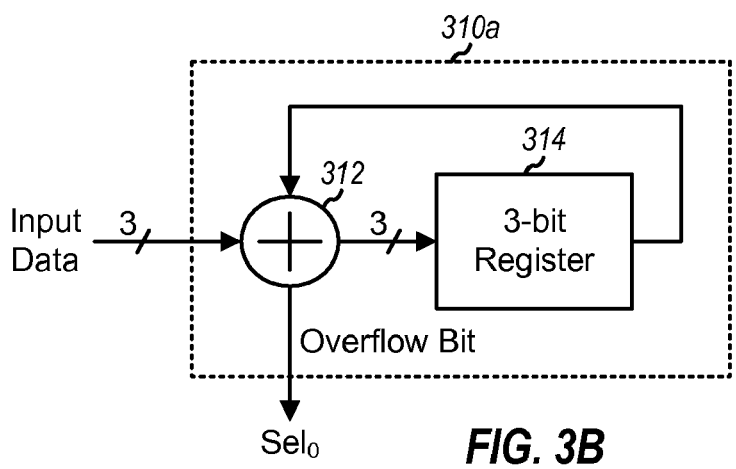
FIG. 3B shows a block diagram of a select signal generator in FIG. 3A.

FIG. 3B shows a block diagram of select signal generator 310a, which includes a 3-bit summer 312 and a 3-bit register 314. Summer 312 receives and sums a 3-bit input data value with a 3-bit stored value from register 314 and provides a 3-bit result to register 314. Summer 312 asserts select signal $Sel_0$ if there is an overflow when summing the input data value with the stored value and de-asserts select signal $Sel_0$ if there is no overflow.

Referring back to FIG. 3A, generators $G_0$ through $G_7$ may each be implemented as shown in FIG. 3B. The registers within generators $G_0$ through $G_7$ may be initialized with progressively decreasing values of 7 through 0, respectively, as shown in line 320. In the example shown in FIG. 3A, the first input data value is 4, the register in each generator is added by 4, and the updated register values for generators $G_0$ through $G_7$ are shown in line 322. The registers in generators $G_0$ through $G_3$ overflow when added with 4, and select signals $Sel_0$ through $Sel_3$ are asserted. The second input data value is 2, the register in each generator is added by 2, and the updated register values for generators $G_0$ through $G_7$ are shown in line 324. The registers in generators $G_4$ and $G_5$ overflow when added with 2, and select signals $Sel_4$ and $Sel_5$ are asserted. The third input data value is 3, the register in each generator is added by 3, and the updated register values for generators $G_0$ through $G_7$ are shown in line 326. The registers in generators $G_0$, $G_6$ and $G_7$ overflow when added with 3, and select signals $Sel_0$, $Sel_6$ and $Sel_7$ are asserted.

The DWA design in FIGS. 3A and 3B cycles through the eight circuit elements and selects as many circuit elements as indicated by an input data value. The eight registers in generators $G_0$ through $G_7$ store the current state of DWA unit 210. The last (or rightmost) select signal that is asserted is indicated by the register with a zero value, which is referred to as the zero position. Whenever a new input data value is received, zero or more select signals are asserted starting with the select signal that is immediately to the right of the current zero position. The number of select signals to assert, and hence the number of places to shift the zero position, is dependent on the input data value. The new zero position is equal to the previous zero position plus the current input data value. The zero position is shifted from left to right based on the input data value and wraps around to the left after reaching the rightmost position.

The zero position may be at one of eight possible places corresponding to the eight generators $G_0$ through $G_7$. Thus, depending on the current zero position, there are eight different ways to represent a given input data value. Which select signals to assert (and hence which circuit elements to select) is pseudo-randomized through the different possible ways of representing the input data based on the state of the registers.

The full DWA DAC has several benefits over the conventional DAC. The errors in the circuit elements are converted from linearity errors to noise, effectively uncorrelating the input data values and the analog output error. This increases the noise floor level, but improves THD. However, the full DWA DAC also has several drawbacks. Full DWA DACs increase the switching rates of the circuit elements as compared to conventional thermometer decoder DACs, whose select signals transition less frequently. This results in more frequent charging and discharging of the circuit elements, and hence, increased glitch energy and degraded dynamic performance.

In addition, the full DWA design in FIGS. 3A and 3B employs K N-bit adders and K N-bit registers for an N-bit DAC. The registers may generate strong digital switching noise, which may adversely impact the performance of the DAC. The full DWA unit also has limited configurability.

Figure 4:
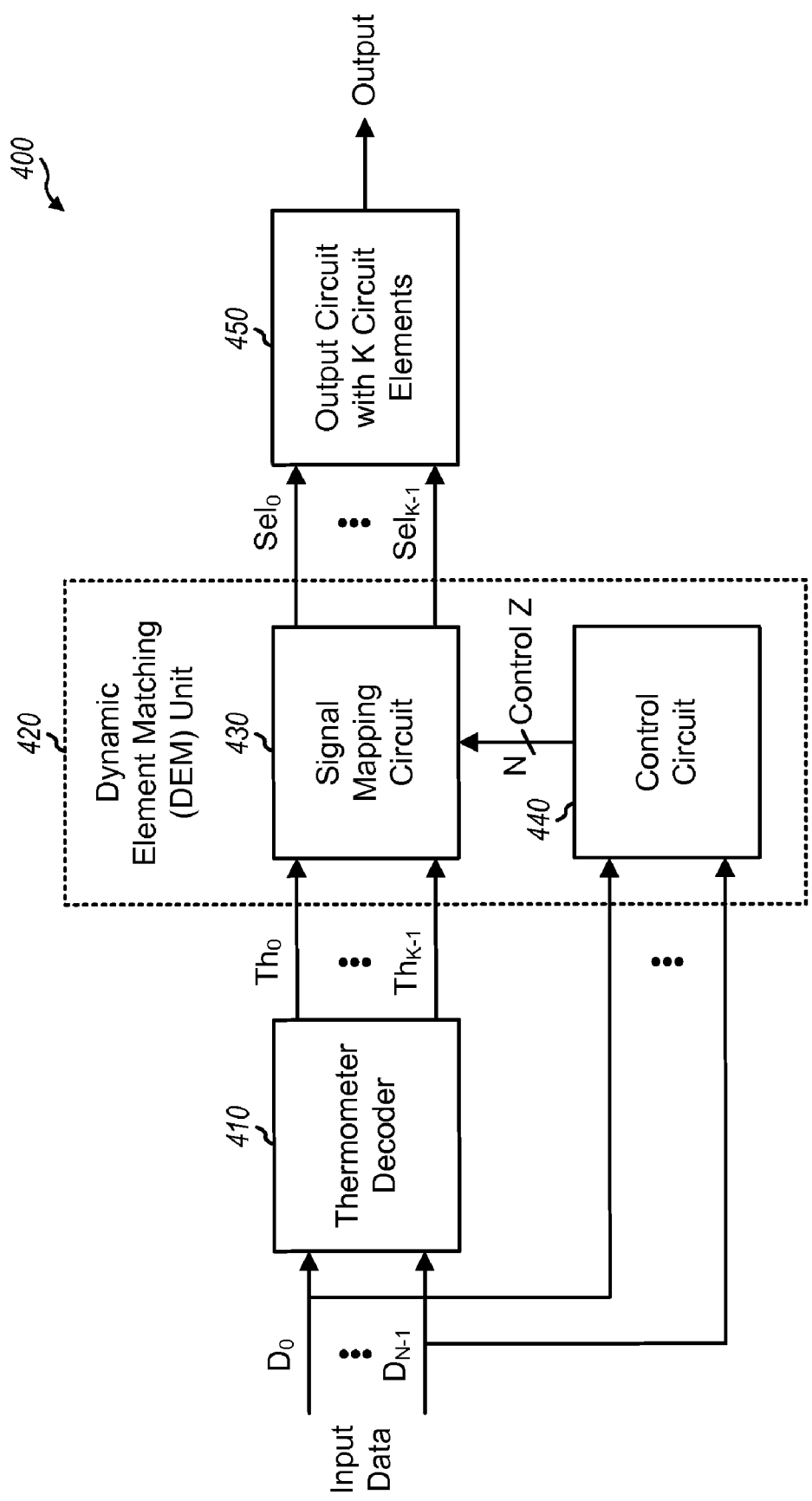
FIG. 4 shows a block diagram of a DAC with dynamic element matching (DEM).

FIG. 4 shows a block diagram of a design of a DAC 400 with dynamic element selection, which is also referred to as dynamic element matching (DEM). In this design, DAC 400 includes a thermometer decoder 410, a DEM unit 420, and an output circuit 450. Decoder 410 receives N-bit input data and provides K decoded signals $Th_0$ through $Th_{K-1}$. Decoder 410 may operate as described above for decoder 110 in FIG. 1. DEM unit 420 receives the K decoded signals and possibly the input data and provides K select signals $Sel_0$ through $Sel_{K-1}$. Output circuit 450 receives the K select signals and generates an analog output signal. Output circuit 450 may include K circuit elements that may be selected by the K select signals, as described above for output circuit 120 in FIG. 1.

In the design shown in FIG. 4, DEM unit 420 includes a signal mapping circuit 430 and a control circuit 440. Signal mapping circuit 430 receives the K decoded signals from decoder 410 and rearranges these signals to achieve pseudo-randomization. Different circuit behavior may be obtained by rearranging the K decoded signals in different manners. For example, signal mapping circuit 430 may circularly rotate the K decoded signals as described below to achieve the DWA behavior shown in FIG. 3A. Control circuit 440 generates a control Z that directs the operation of signal mapping circuit 430 and affects how the K select signals are generated. Control circuit 440 may flexibly support multiple modes of operation, as described below.

Figure 5A:
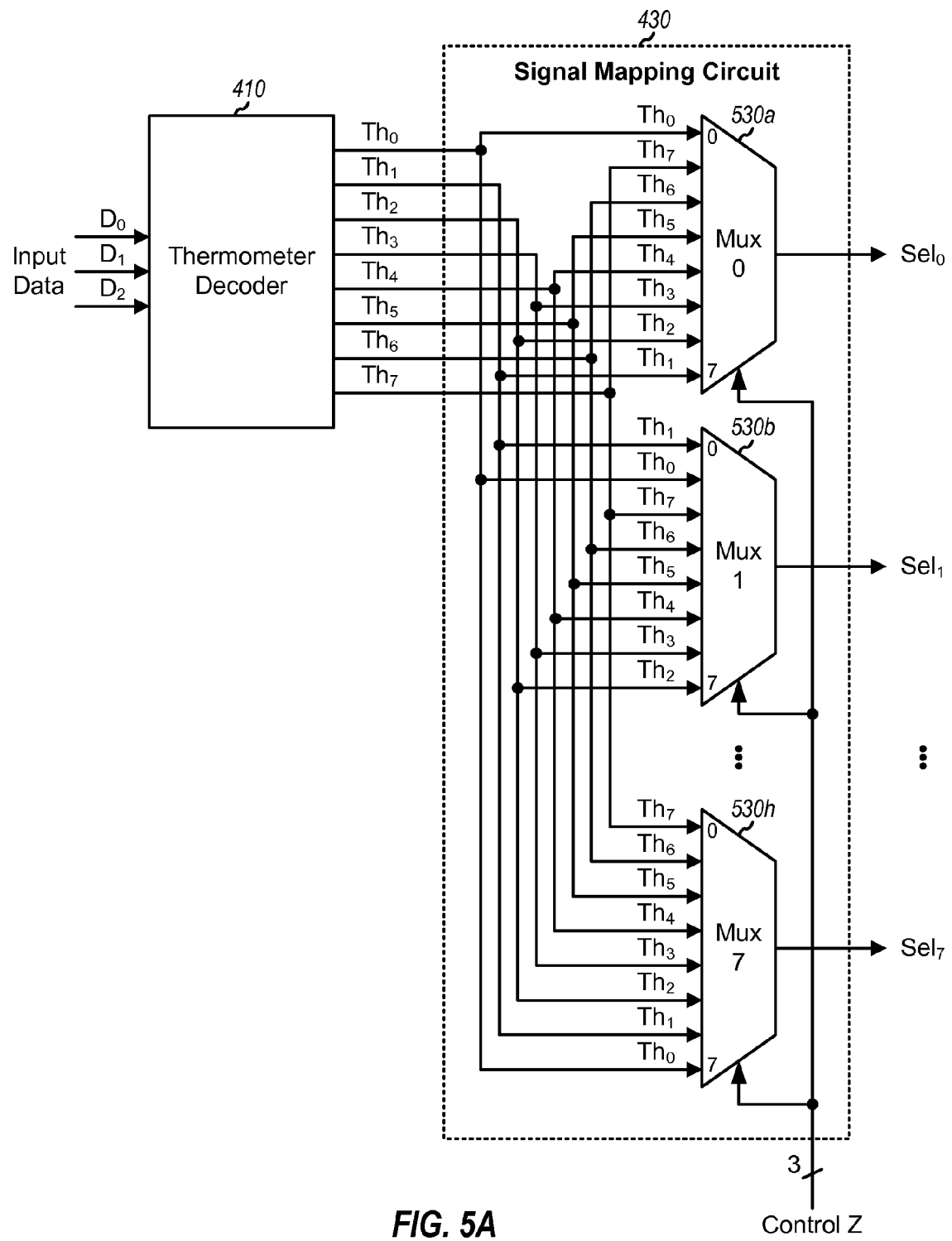
FIG. 5A shows a block diagram of a signal mapping circuit within the DEM unit.

FIG. 5A shows a block diagram of a design of signal mapping circuit 430 within DEM unit 420 in FIG. 4. For clarity, FIG. 5A show a design for a case in which N=3 and K=8.

Thermometer decoder 410 receives 3-bit input data $D_0$, $D_1$ and $D_2$ and generates eight decoded signals $Th_0$ through $Th_7$. Decoder 410 asserts the decoded signals in a predetermined order, starting with decoded signal $Th_0$, based on the input data value. Table 1 gives the logic value of the eight decoded signals $Th_0$ through $Th_7$ for each possible 3-bit input data value. As shown in Table 1, decoder 410 asserts only one decoded signal $Th_0$ for an input data value of 1, asserts two decoded signals $Th_0$ and $Th_1$ for an input data value of 2, and so on, and asserts seven decoded signals $Th_0$ through $Th_6$ for an input data value of 7.

TABLE 1

| Thermometer Decoder Output | | | | | | | | |
|---|---|---|---|---|---|---|---|---|
| Data Input | $Th_0$ | $Th_1$ | $Th_2$ | $Th_3$ | $Th_4$ | $Th_5$ | $Th_6$ | $Th_7$ |
| 0 | 0 | 0 | 0 | 0 | 0 | 0 | 0 | 0 |
| 1 | 1 | 0 | 0 | 0 | 0 | 0 | 0 | 0 |
| 2 | 1 | 1 | 0 | 0 | 0 | 0 | 0 | 0 |
| 3 | 1 | 1 | 1 | 0 | 0 | 0 | 0 | 0 |
| 4 | 1 | 1 | 1 | 1 | 0 | 0 | 0 | 0 |
| 5 | 1 | 1 | 1 | 1 | 1 | 0 | 0 | 0 |
| 6 | 1 | 1 | 1 | 1 | 1 | 1 | 0 | 0 |
| 7 | 1 | 1 | 1 | 1 | 1 | 1 | 1 | 0 |

Signal mapping circuit 430 receives the eight decoded signals $Th_0$ through $Th_7$ and provides eight select signals $Sel_0$ through $Sel_7$. In the design shown in FIG. 5A, signal mapping circuit 430 includes eight 8×1 multiplexers (Mux) 530a through 530h, which are also referred to as multiplexers 0 through 7, respectively. Each multiplexer has eight inputs that receive all eight decoded signals $Th_0$ through $Th_7$ from decoder 410. However, the eight decoded signals $Th_0$ through $Th_7$ are provided to multiplexers 0 through 7 in different orders to achieve rotation of the select signals that are asserted.

The eight decoded signals may be denoted by an 8-element set $T_0 = \{Th_0, Th_1, Th_2, Th_3, Th_4, Th_5, Th_6, Th_7\}$. A circular rotation of the eight decoded signals by m positions may be achieved by taking the first m elements in set $T_0$ and moving these m elements to the end of set $T_0$ to obtain a circularly rotated set $T_m$. For example, a circular rotation of 1 position may be given as $T_1 = \{Th_1, Th_2, Th_3, Th_4, Th_5, Th_6, Th_7, Th_0\}$. The eight decoded signals $Th_0$ through $Th_7$ are provided directly to input 0 of multiplexers 0 through 7, respectively. The eight decoded signals circularly rotated by one position are provided to input 1 of the eight multiplexers. In general, the eight decoded signals circularly rotated by m positions are provided to input m of the eight multiplexers, where $0 \leq m \leq 7$.

Table 2 gives the mapping of the eight decoded signals to the eight inputs of each multiplexer. For example, multiplexer 0 receives decoded signal $Th_0$ at input 0, decoded signal $Th_7$ at input 1, and so on, and decoded signal $Th_1$ at input 7.

also be mapped to the inputs of the multiplexers based on some other mapping to achieve different output behavior. In any case, the mapping of the decoded signals to the select signals allows the K circuit elements in output circuit 450 to be dynamically selected to combat mismatches in these circuit elements.

TABLE 2

| Mux Input | Mux 0 | Mux 1 | Mux 2 | Mux 3 | Mux 4 | Mux 5 | Mux 6 | Mux 7 | Control Z |
|---|---|---|---|---|---|---|---|---|---|
| 0 | $Th_0$ | $Th_1$ | $Th_2$ | $Th_3$ | $Th_4$ | $Th_5$ | $Th_6$ | $Th_7$ | $Z = 0$ |
| 1 | $Th_7$ | $Th_0$ | $Th_1$ | $Th_2$ | $Th_3$ | $Th_4$ | $Th_5$ | $Th_6$ | $Z = 1$ |
| 2 | $Th_6$ | $Th_7$ | $Th_0$ | $Th_1$ | $Th_2$ | $Th_3$ | $Th_4$ | $Th_5$ | $Z = 2$ |
| 3 | $Th_5$ | $Th_6$ | $Th_7$ | $Th_0$ | $Th_1$ | $Th_2$ | $Th_3$ | $Th_4$ | $Z = 3$ |
| 4 | $Th_4$ | $Th_5$ | $Th_6$ | $Th_7$ | $Th_0$ | $Th_1$ | $Th_2$ | $Th_3$ | $Z = 4$ |
| 5 | $Th_3$ | $Th_4$ | $Th_5$ | $Th_6$ | $Th_7$ | $Th_0$ | $Th_1$ | $Th_2$ | $Z = 5$ |
| 6 | $Th_2$ | $Th_3$ | $Th_4$ | $Th_5$ | $Th_6$ | $Th_7$ | $Th_0$ | $Th_1$ | $Z = 6$ |
| 7 | $Th_1$ | $Th_2$ | $Th_3$ | $Th_4$ | $Th_5$ | $Th_6$ | $Th_7$ | $Th_0$ | $Z = 7$ |
|   | $Sel_0$ | $Sel_1$ | $Sel_2$ | $Sel_3$ | $Sel_4$ | $Sel_5$ | $Sel_6$ | $Sel_7$ |   |

All eight multiplexers 0 through 7 receive the same 3-bit control Z. Control Z indicates the current zero position and may be generated as described below. When control Z is equal to m, the decoded signals at input m of multiplexers 0 through 7 are provided as select signals $Sel_0$ through $Sel_7$, respectively. Multiplexers 0 through 7 thus map decoded signals $Th_0$ through $Th_7$ to select signals $Sel_0$ through $Sel_7$ based on the current zero position indicated by control Z.

Figure 5B:
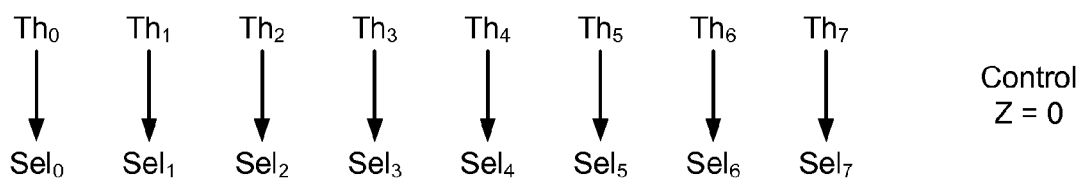
FIGS. 5B, 5C and 5D show mapping of the first/decoded signals to the second/select signals for control values of 0, 1 and 2, respectively.

FIG. 5B shows the mapping of the decoded signals to the select signals when control Z is equal to 0. Decoded signals $Th_0$ through $Th_7$ are provided directly as select signals $Sel_0$ through $Sel_7$, respectively, as shown by the line for Z=0 in Table 2. Select signal $Sel_0$ is asserted for an input data value of 1, select signals $Sel_0$ and $Sel_1$ are asserted for an input data value of 2, etc.

Figure 5C:
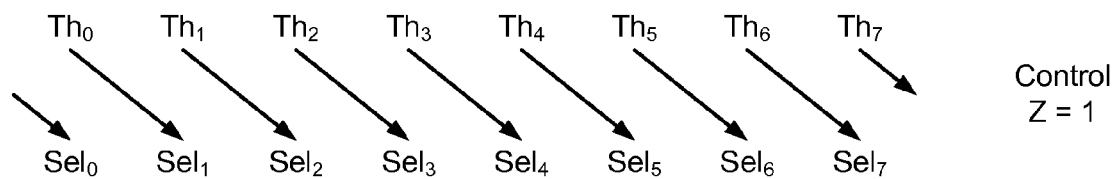

FIG. 5C shows the mapping of the decoded signals to the select signals when control Z is equal to 1. Decoded signals $Th_7, Th_0, \ldots, Th_6$ are provided as select signals $Sel_0$ through $Sel_7$, respectively, as shown by the line for Z=1 in Table 2. Select signal $Sel_1$ is asserted for an input data value of 1, select signals $Sel_1$ and $Sel_2$ are asserted for an input data value of 2, etc.

Figure 5D:
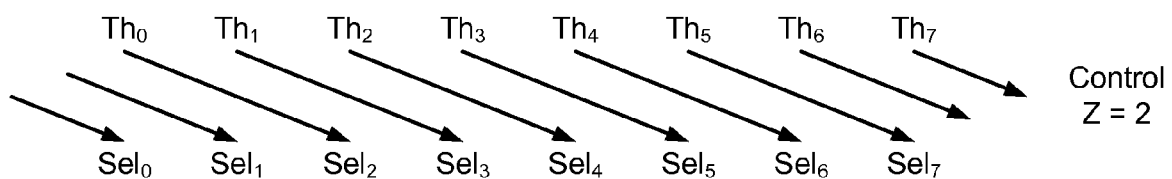

FIG. 5D shows the mapping of the decoded signals to the select signals when control Z is equal to 2. Decoded signals $Th_6, Th_7, Th_0, \ldots, Th_5$ are provided as select signals $Sel_0$ through $Sel_7$, respectively, as shown by the line for Z=2 in Table 2. Select signal $Sel_2$ is asserted for an input data value of 1, select signals $Sel_2$ and $Sel_3$ are asserted for an input data value of 2, etc.

The mapping of the decoded signals to the select signals for other values of control Z are shown in Table 2. Different select signals are asserted first for different values of control Z, as indicated by the shifting position of decoded signal $Th_0$ for different control Z values.

In the design shown in FIG. 5A, the eight decoded signals $Th_0$ through $Th_7$ are mapped to the inputs of multiplexers 0 through 7 such that signal mapping circuit 430 can implement the DWA design shown in FIG. 3A. The eight possible values for control Z correspond to eight possible zero positions in FIG. 3A, as shown by the position of decoded signal $Th_0$ in Table 2. Multiplexers 0 through 7 circularly rotate the decoded signals to achieve pseudo-randomization in the select signals.

Figure 6A:
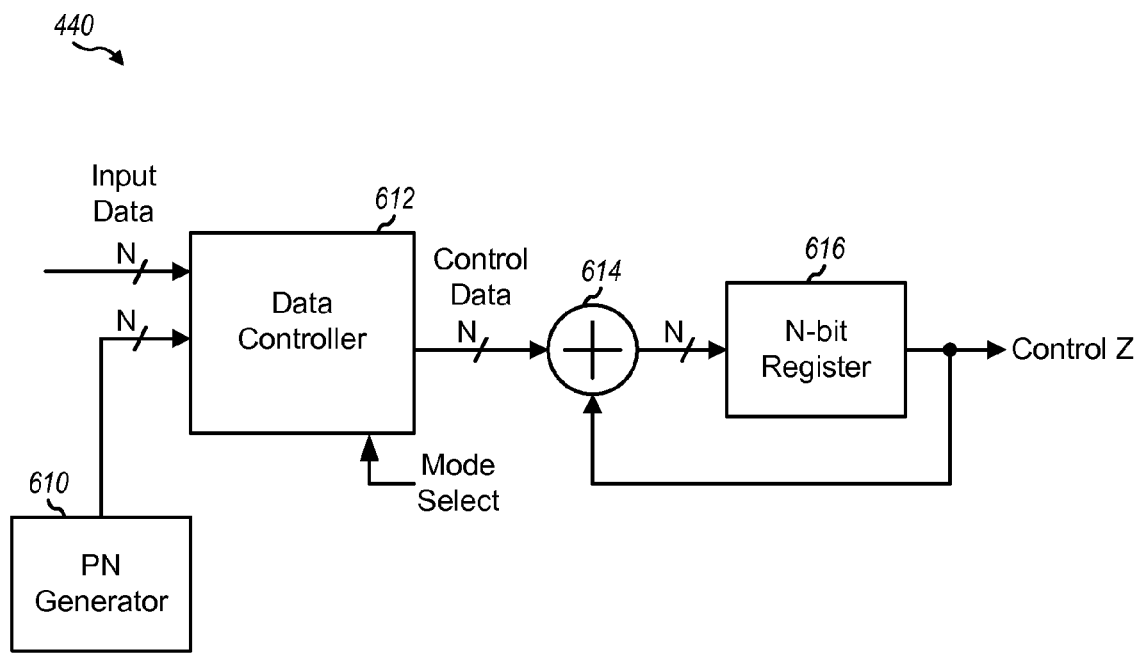
FIG. 6A shows a block diagram of a control circuit within the DEM unit.

FIG. 5A shows one design of mapping the decoded signals to the inputs of the multiplexers. The decoded signals may FIG. 6A shows a block diagram of a design of control circuit 440 within DEM unit 420 in FIG. 4. In this design, DEM unit 420 supports the modes of operation shown in Table 3.

TABLE 3

Modes of Operation

| Mode | Description |
|---|---|
| DWA | The select signals are generated using the input data. |
| Pseudo-random | The select signals are generated using pseudo-random data. |
| Bypass | The decoded signals are provided directly as the select signals. |

In the DWA mode, the zero position is updated based on the input data or a desired fraction thereof, and the select signals are asserted starting with the select signal at the current zero position. In the pseudo-random mode, the zero position is updated based on pseudo-random data, and the select signals are asserted starting with the select signal at the current zero position. The DWA mode and the pseudo-random mode differ in how the zero position is updated. The zero position may also be updated in other manners, e.g., based on a combination of the input data and pseudo-random data, based on a fixed non-zero value, etc. In the bypass mode, the select signals are essentially generated based on thermometer decoding, without any randomization. Other modes of operation may also be supported. For example, the zero position may be updated by a fixed non-zero value (e.g., 1, 2, etc.) in each sample period and may thus be shifted at a constant rate.

Within DEM unit 420, a data controller 612 receives input data, pseudo-random data from a pseudo-random number (PN) generator 610, and a mode select signal. The mode select signal indicates the desired operating mode, and provides other mode-specific control information. Data controller 612 outputs control data to a summer 614 based on the desired operating mode as indicated by the mode select signal. The summer 614 sums the control data from data controller 612 with the current control value from a register 616 and provides an updated control value to register 616. Register 616 provides the current control value as the N-bit control Z to signal mapping circuit 430.

Summer 614 and register 616 implement a wrap-around accumulator that updates the zero position based on the control data from data controller 612. In the DWA mode, the zero position is updated based on the fractional input data from data controller 612. In the pseudo-random mode, the zero position is updated based on the pseudo-random data from data controller 612. In the bypass mode, register 616 is initialized to zero, and the zero position is updated with 0 from data controller 612 and hence does not change.

PN generator 610 may be implemented with a linear feedback shift register (LFSR) having a length greater than N. The LFSR may implement any primitive polynomial generator function. The N least significant bits (LSBs) of the LFSR may be provided as N-bit pseudo-random data. The pseudo-random data may also be obtained in other manners, e.g., with a look-up table.

Figure 6B:
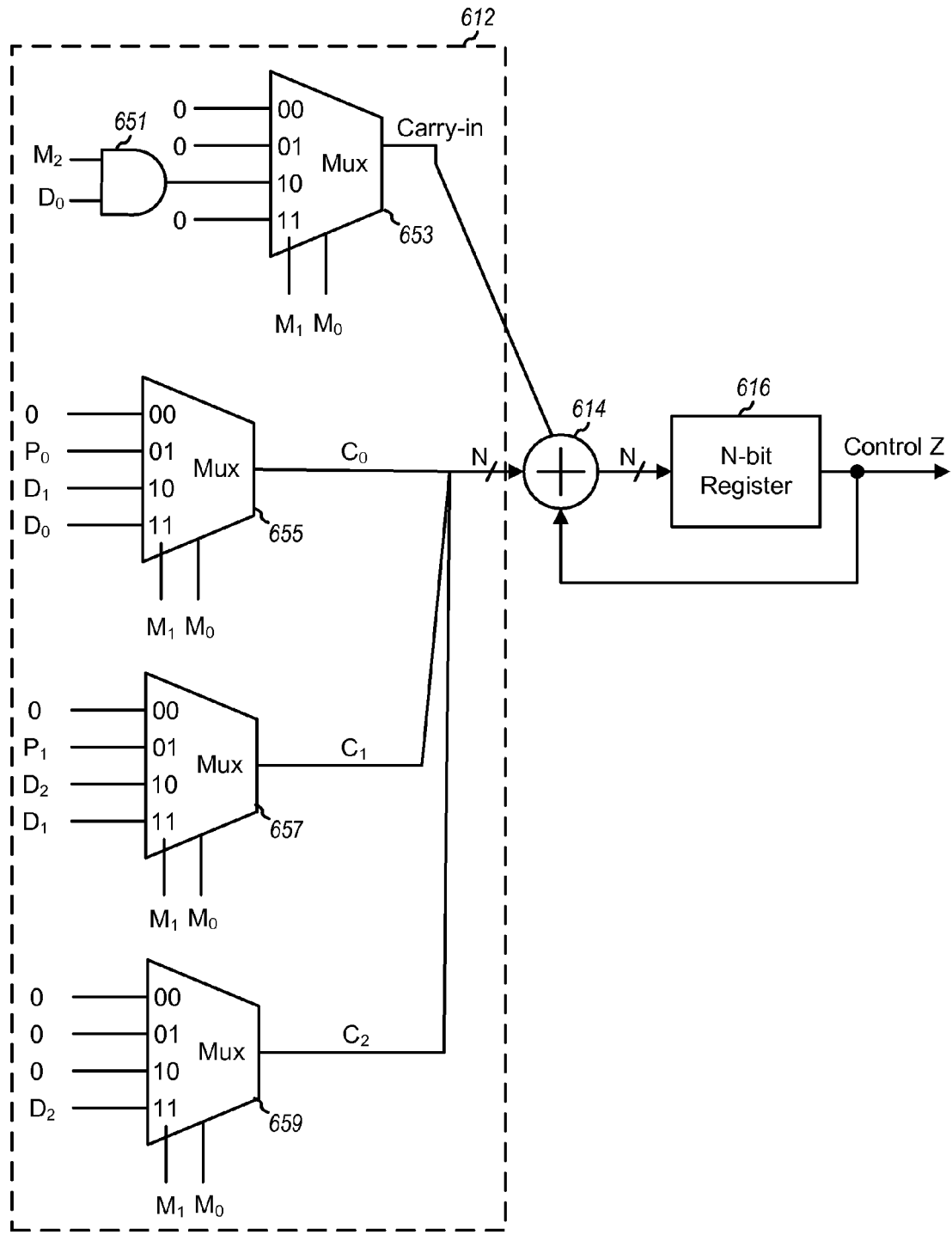
FIG. 6B shows a design of the data controller of FIG. 6A configured for one-half fractional data weighting according to an embodiment of the present invention.

FIG. 6B shows a design of data controller 612 in FIG. 6A configured for one-half fractional data weighting according to an embodiment of the invention. As shown, data controller 612 receives 3-bit input data $D_0$, $D_1$, and $D_2$, 2-bit pseudo-random data $P_0$ and $P_1$, and a 3-bit mode select signal $M_0$, $M_1$, and $M_2$. Data controller 612 outputs control data $C_0$, $C_1$, and $C_2$, and a carry-in bit, based on the desired operating mode.

As discussed above, the mode select signal may include other mode-specific information. For example, because a given fraction of the input data may not be a whole number (e.g., one-half of a data input value of 3 is 1.5, which is a non-physical shift amount), the mode select signal may include mode-specific information instructing data controller 612 to round the fractional result in order to handle non-physical shifts. In the embodiment of FIG. 6B, the fractional DWA may round the shift amount up or down in a round-up mode or a round-down mode, respectively. In this design, the mode select signal indicates the modes of operation shown in Table 4.

TABLE 4

Mode Select Signal

| Mode Select ($M_2$, $M_1$, $M_0$) | Operating Mode |
| --- | --- |
| x00 | Conventional Thermometer Decoding |
| x01 | Pseudo-Random Mode |
| 010 | Fractional DWA, Round-Down |
| 110 | Fractional DWA, Round-Up |
| 111 | Full DWA |

As shown in FIG. 6B, data controller 612 includes an AND-gate 651 and four multiplexers 653-659, the multiplexers being controlled by bits $M_1$ and $M_0$ of the mode select signal. AND-gate 651 receives bit M2 and D0 as inputs, and outputs a logical AND value to multiplexer 653. Multiplexer 653 receives the logical AND value at a port corresponding to $M_1=1$ and $M_0=0$ (port '10'), and a '0' at all other input ports. Multiplexer 653 generates the carry-in value. Multiplexer 655 receives a '0' at port '00', $P_0$ at port '01', $D_1$ at port '10', and $D_0$ at port '11'. Multiplexer 655 generates $C_0$. Multiplexer 657 receives a '0' at port '00', $P_1$ at port '01', $D_2$ at port '10', and $D_1$ at port '11'. Multiplexer 657 generates $C_1$. Multiplexer 659 receives a '0' at ports '00', '01', and '10', and receives $D_2$ at port '11'. Multiplexer 659 generates $C_2$.

Thus, in the conventional thermometer decoding mode, data controller 612 outputs carry-in='0', and control data $C_0$='0', $C_1$='0', and $C_2$='0'. Control Z remains at zero, which maintains the zero position of DWA 400 in its initial state. In the pseudo-random mode, data controller 612 outputs carry-in='0', and control data $C_0$='$P_0$', $C_1$='$P_1$', and $C_2$='0'. Control Z is thus updated by a random value, which randomly shifts the zero position of DWA 400.

In the fractional DWA, round-down mode, data controller 612 outputs carry-in='0', and control data $C_0$='$D_1$', $C_1$='$D_2$', and $C_2$='0'. Control Z is thus updated by an amount equal to half of the input data, rounded down. For example, if the input data is 3 ($D_1$=1, $D_1$=1, and $D_2$=0), control Z is updated by the sum of 0 (carry-in value) and 1 (control data value), thereby shifting the zero position of DWA 400 by one unit. In this mode, the select signals will be asserted and the zero position updated using a fraction of the data weight.

In the fractional DWA, round-up mode, data controller 612 outputs carry-in='$D_0$', and control data $C_0$='$D_1$', $C_1$='$D_2$', and $C_2$='0'. Control Z is thus updated by an amount equal to half of the input data, rounded up. For example, if the input data is 3 ($D_0$=1, $D_1$=1, and $D_2$=0), control Z is updated by the sum of 1 (carry-in value) and 1 (control data value), thereby shifting the zero position of DWA 400 by two units. In this mode, the select signals will be asserted and the zero position updated using a fraction of the data weight.

In the full DWA mode, data controller 612 outputs carry-in='0', and control data $C_0$='$D_0$', $C_1$='$D_1$', and $C_2$='$D_2$' (i.e., the full input data). Control Z is thus updated by an amount equal to the input data. For example, if the input data is 3 ($D_0$=1, $D_1$=1, and $D_2$=0), control Z is updated by the sum of 0 (carry-in value) and 3 (control data value), thereby shifting the zero position of DWA 400 by three units. In this mode, the select signals will be asserted and the zero position updated using the full data weight, similar to the full DWA design of FIGS. 3A and 3B.

Figure 7A:
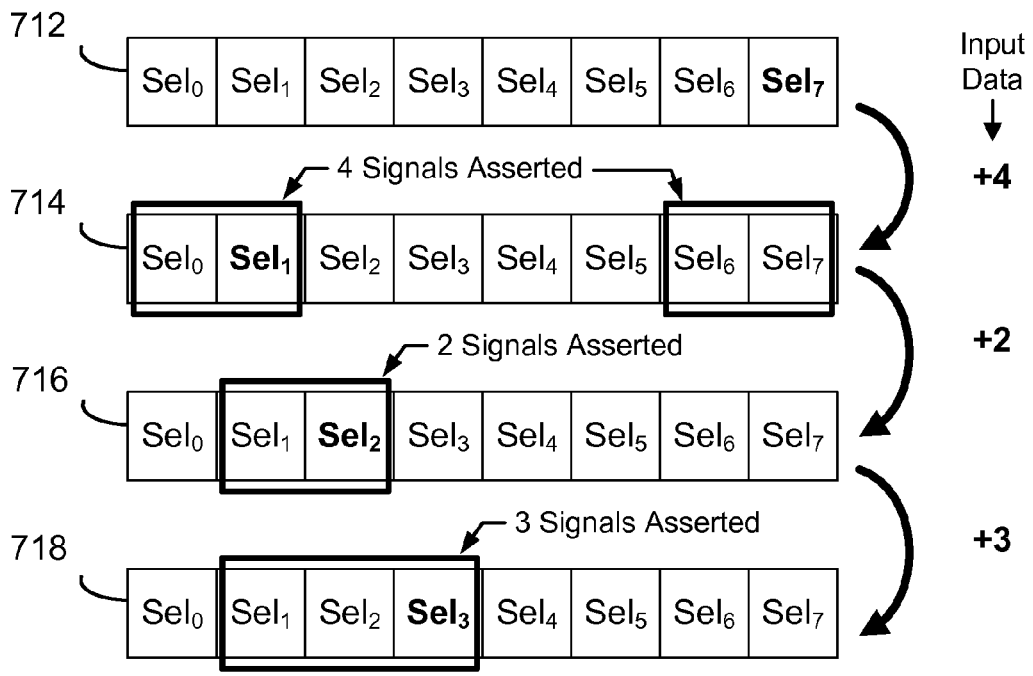
FIGS. 7A and 7B illustrate selection of circuit elements according to an embodiment of the present invention.

FIG. 7A illustrates an example progression of zero position updating and select signal assertions in a one-half fractional DWA, round-down mode, for 3-bit input data of +4, +2, and +3, sequentially.

Initially, in state 712, the zero position is set to correspond to $Sel_7$ and control Z is initialized to zero (i.e., register 616 is cleared). When input data of +4 ($D_0$=0, $D_1$=1, and $D_2$=1) is input to DWA 400, control Z is updated by the sum of 0 (carry-in value) and 2 (control data value), thereby shifting the zero position of DWA 400 by two units to correspond to $Sel_1$. Thus, in state 714, select signals $Sel_1$, $Sel_0$, $Sel_7$, and $Sel_6$ are asserted by signal mapping circuit 430. When input data of +2 ($D_0$=0, $D_1$=1, and $D_2$=0) is input to DWA 400, control Z is updated by the sum of 0 (carry-in value) and 1 (control data value), thereby shifting the zero position of DWA 400 by one unit to correspond to $Sel_2$. Thus, in state 716, select signals $Sel_2$, and $Sel_1$ are asserted by signal mapping circuit 430. When input data of +3 ($D_0$=1, $D_1$=1, and $D_2$=0) is input to DWA 400, control Z is updated by the sum of 0 (carry-in value) and 1 (control data value), thereby shifting the zero position of DWA 400 by one unit to correspond to $Sel_3$. Thus, in state 728, select signals $Sel_3$, $Sel_2$, and $Sel_1$ are asserted by signal mapping circuit 430.

Figure 7B:
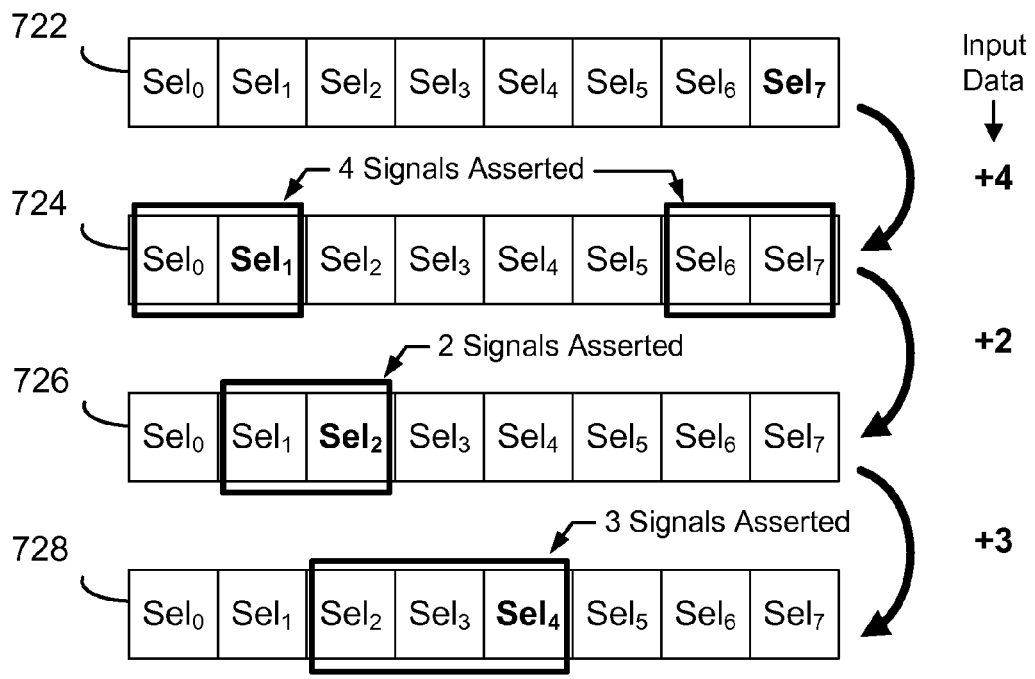

FIG. 7B illustrates an example progression of zero position updating and select signal assertions in a one-half fractional DWA, round-up mode, for 3-bit input data of +4, +2, and +3, sequentially.

Initially, in state 722, the zero position is again set to correspond to $Sel_7$ and control Z is again initialized to zero (i.e., register 616 is cleared). When input data of +4 ($D_0$=0, $D_1$=1, and $D_2$=1) is input to DWA 400, control Z is updated by the sum of 0 (carry-in value) and 2 (control data value), thereby shifting the zero position of DWA 400 by two units to correspond to $Sel_1$. Thus, in state 724, select signals $Sel_1$, $Sel_0$, $Sel_7$, and $Sel_6$ are asserted by signal mapping circuit 430, as in the round-down mode of FIG. 7A. When input data of +2 ($D_0=0$, $D_1=1$, and $D_2=0$) is input to DWA 400, control Z is updated by the sum of 0 (carry-in value) and 1 (control data value), thereby shifting the zero position of DWA 400 by one unit to correspond to $Sel_2$. Thus, in state 726, select signals $Sel_2$, and $Sel_1$ are asserted by signal mapping circuit 430, as in the round-down mode of FIG. 7A. However, when input data of +3 ($D_0=1$, $D_1=1$, and $D_2=0$) is input to DWA 400, control Z is updated by the sum of 1 (carry-in value) and 1 (control data value), thereby shifting the zero position of DWA 400 by two units to correspond to $Sel_4$. Thus, in state 728, select signals $Sel_4$, $Sel_3$, and $Sel_2$ are asserted by signal mapping circuit 430, in contrast to the round-down mode of FIG. 7A.

As illustrated in FIGS. 7A and 7B, the zero position may be shifted to a lesser degree than in the DWA design of FIGS. 3A and 3B using fractional data weighting according to embodiments of the invention. For reasons that will be discussed in more detail below, it may be advantageous to provide some overlap in the select signals that are asserted from one state to the next.

Using a fractional weight as opposed to the full weight of the input data to generate control Z may have several advantages, depending on the application. The fractional DWA modes still provide randomization of the circuit elements, although to a lesser degree than the full DWA mode, depending on the desired fractional weight. This retains, to a degree dependent on the desired fractional weight, the advantage of the full DWA DAC over the conventional DAC in converting linearity errors to noise, which helps reduce the correlation between input data values and any analog output error. In addition, the fractional DWA modes have a reduced switching rate of the circuit elements when compared to the full DWA mode because some of the previously charged/discharged circuit elements may be maintained in their current state. This helps to mitigate some of the drawbacks of the full DWA DAC when compared to the conventional DAC due to frequent charging and discharging of the circuit elements. The fractional DWA modes according to embodiments of the present invention charge and discharge the circuit elements less than the full DWA mode, again dependent on the desired fractional weight. Hence, when compared to a full DWA DAC, a DAC implementing a DEM unit according to an embodiment of the present invention operating in a fractional DWA mode has a reduced glitch energy which results in improved dynamic performance, e.g., improved THD.

It will be appreciated by one skilled in the art that the one-half fractional weighting scheme described above is provided for illustration purposes, and is not intended to limit the desired fractional weight used in various fractional weighting schemes according to various embodiments of the invention. For example, the desired fractional weighting may be one-third, one-quarter, etc., of the data weight. Accordingly, the fractional weight and rounding mode may be selected according to the performance requirements of a particular application to effectively trade-off the advantages and disadvantages associated with both the conventional DAC and the full DWA DAC. Thus, depending on the application, a DAC implementing a DEM unit according to an embodiment of the present invention operating in a fractional DWA mode may be advantageous over both the conventional DAC and the full DWA DAC.

Figure 8:
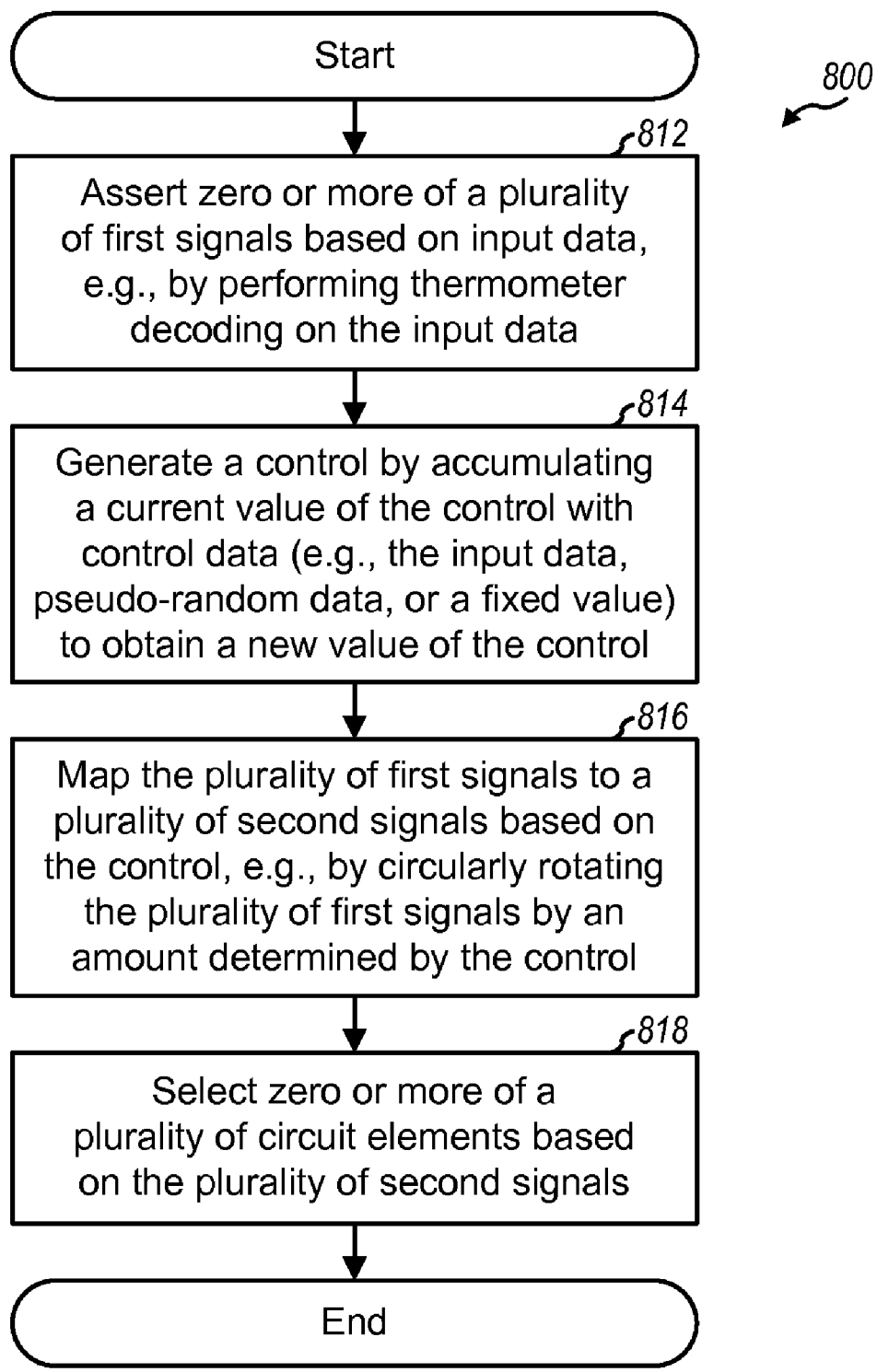
FIG. 8 shows a process for dynamically selecting circuit elements.

FIG. 8 shows a design of a process 800 for dynamically selecting circuit elements, e.g., in a DAC or some other circuit. Zero or more of a plurality of first signals may be asserted in a predetermined order based on input data, e.g., by performing thermometer decoding on the input data (block 812). A control may be generated by accumulating the current value of the control with control data to obtain a new value of the control (block 814). The control data may be the input data, pseudo-random data, a fixed non-zero value, zero, etc. The plurality of first signals may be mapped to a plurality of second signals based on the control (block 816). The control may indicate the next second signal to assert for the next input data value. The first and second signals may correspond to the decoded and select signals, respectively, described above. The plurality of first signals may be circularly rotated by an amount determined by the control and provided as the plurality of second signals. Zero or more of a plurality of circuit elements may be selected based on the plurality of second signals (block 818). For DWA, the plurality of second signals may select the plurality of circuit elements in a sequential order, starting with the circuit element that is immediately after the last selected circuit element. The number of first signals to assert, and hence the number of second signals to assert, may be determined by the input data.

Figure 9:
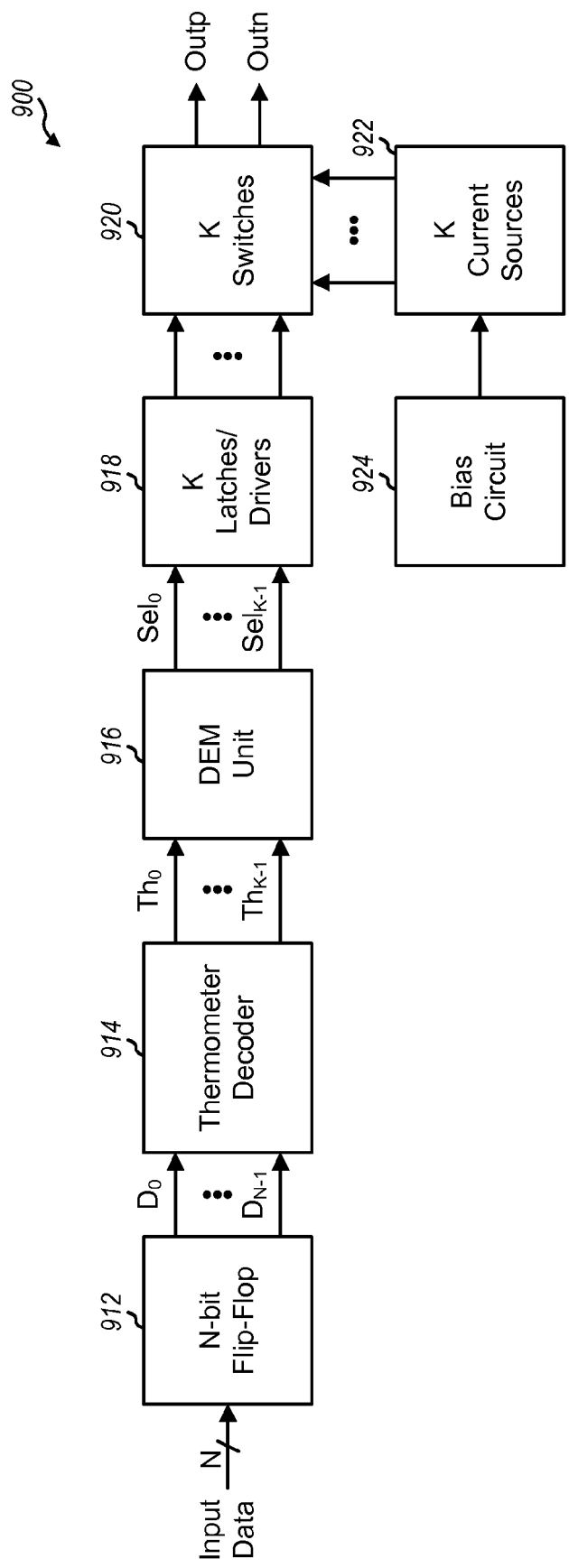
FIG. 9 shows a block diagram of a DAC with DEM.

FIG. 9 shows a block diagram of a design of a DAC 900 with DEM. In this design, DAC 900 includes K current sources 922 that generate K reference currents of equal amount. Mismatches in the K reference currents may be ameliorated by dynamically selecting the K reference currents.

Within DAC 900, an N-bit flip-flop 912 receives N-bit input data, clocks the input data with a clock, and provides N data bits $D_0$ through $D_{N-1}$ in each sample period. A thermometer decoder 914 receives the N data bits and provides K decoded signals $Th_0$ through $Th_{K-1}$. A DEM unit 916 receives the K decoded signals $Th_0$ through $Th_{K-1}$ and provides K select signals $Sel_0$ through $Sel_{K-1}$. DEM unit 916 may be implemented with DEM unit 420 shown in FIGS. 4 through 6.

K latches/drivers 918 receive the K select signals and provide K control signals for K switches 920. K switches 920 also receive the K reference currents of equal amount from K current sources 922. Each of the K switches 920 steers its reference current to either an Outp output or an Outn output based on its control signal. Latches 918 ensure synchronous switching of the K reference currents in order to reduce glitch energy in the Outp or Outn signals. A bias circuit 924 generates a bias voltage for K current sources 922.

FIG. 9 shows a DAC design in which thermometer decoding is performed for all N bits. In general, a DAC may be implemented with one or more sections, and each section may be implemented with thermometer decoding or binary decoding. For example, a DAC may be implemented with two sections—a first section for M most significant bits (MSBs) among the N total bits, and a second section for L LSBs among the N total bits, where N=M+L. Each section may be implemented with thermometer decoding and DEM as described above.

Figure 10:
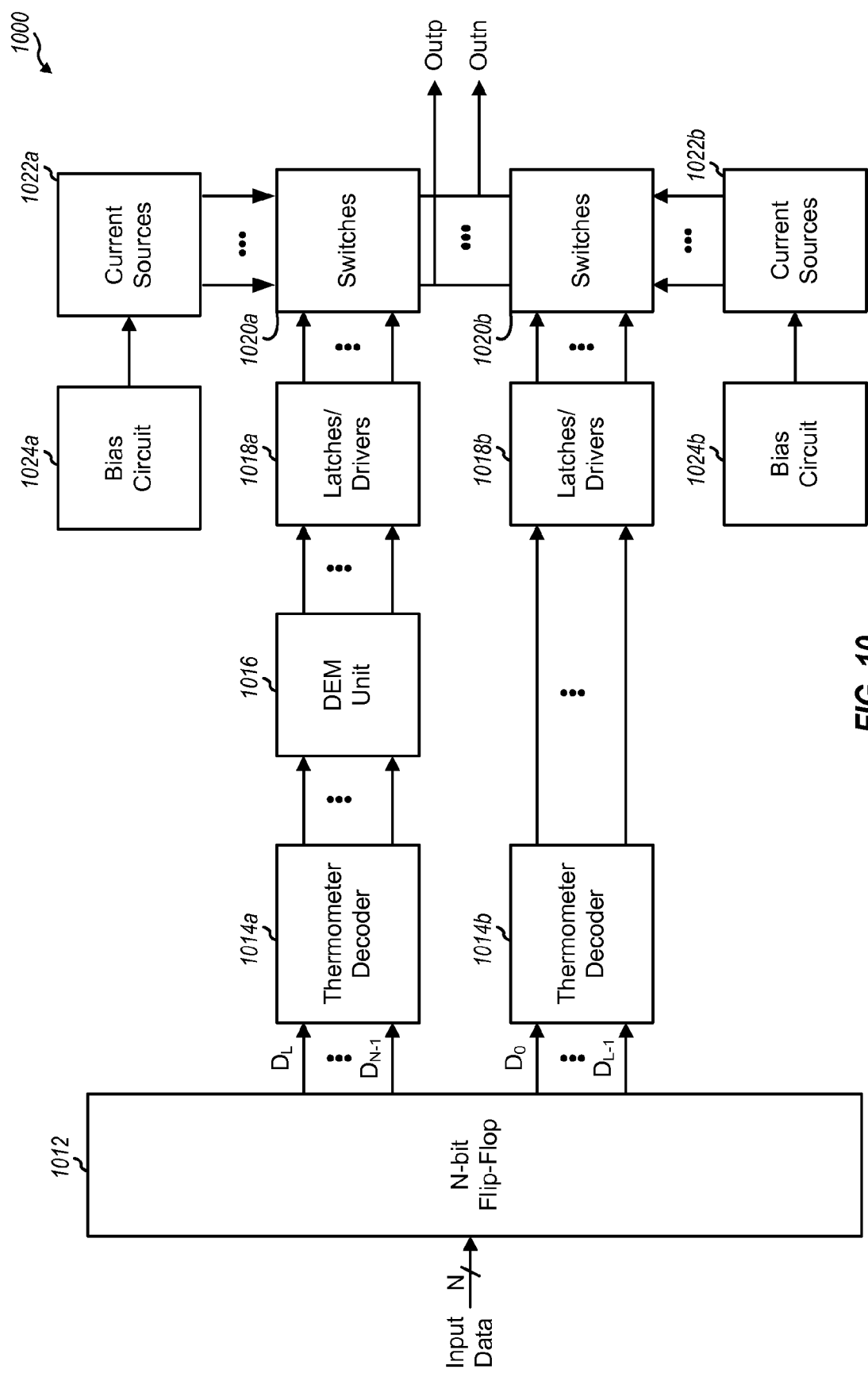
FIG. 10 shows a block diagram of a DAC according to an embodiment of the present invention.

FIG. 10 illustrates an example DAC design according to an embodiment of the present invention. In this design, a DEM unit operates only on the M most significant bits. In this design, a first circuit including the DEM operates on data inputs $D_L$ through $D_{N-1}$ in the manner described above for the DAC design of FIG. 9. Within the first circuit of DAC 1000, a thermometer decoder 1014a receives the M data bits $D_L$ through $D_{N-1}$ and provides decoded signals to DEM unit 1016. DEM unit 1016 receives the decoded signals and provides select signals to latches/drivers 1018a. DEM unit 1016 may be implemented with DEM unit 420 shown in FIGS. 4 through 6.

Latches/drivers 1018a receive the select signals and provide control signals for switches 1020a. Switches 1020a also receive the reference currents of equal amount from current sources 1022a. Each of the switches steers its reference current to either an Outp output or an Outn output based on its control signal. Latches 1018a ensure synchronous switching of the reference currents in order to reduce glitch energy in the Outp or Outn signals. A bias circuit 1024a generates a bias voltage for current sources 1022a.

A second circuit without a DEM unit operates on least significant bit data inputs $D_0$ through $D_{L-1}$. Within the second circuit of DAC 1000, a thermometer decoder 1014b receives the L data bits $D_0$ through $D_{L-1}$ and provides decoded signals directly to latches/drivers 1018b. Latches/drivers 1018b receive the select signals and provide control signals for switches 1020b. Switches 1020b also receive the reference currents of equal amount from current sources 1022b. Each of the switches steers its reference current to either an Outp output or an Outn output based on its control signal. The outputs Outp and Outn of switches 1020b are connected to the outputs Outp and Outn of switches 1020a to provide a common output path. Latches 1018b ensure synchronous switching of the reference currents in order to reduce glitch energy in the Outp or Outn signals. A bias circuit 1024b generates a bias voltage for current sources 1022a.

This DAC design may be advantageous in that it does not necessarily continually charge and discharge circuit elements for the least significant bits $D_0$ through $D_{L-1}$. These bits are the most probable to be continually asserted from one state to the next due to the predetermined order of the thermometer decoder output signals. Thus, the DAC design of FIG. 10 may provide a relatively faster switching rate than a DAC with a DWA unit operating on each input data bit, yet retain some of the randomization advantages discussed infra.

The current sources, switches, and latches need not be one-dimensional, but may also be implemented as a multi-dimensional array of elements. For example, the first circuit of FIG. 10 with a DEM unit operating on most significant bits M may be implemented using a two-dimensional array of switches and corresponding latches/drivers to output a plurality of current sources.

Figure 11:
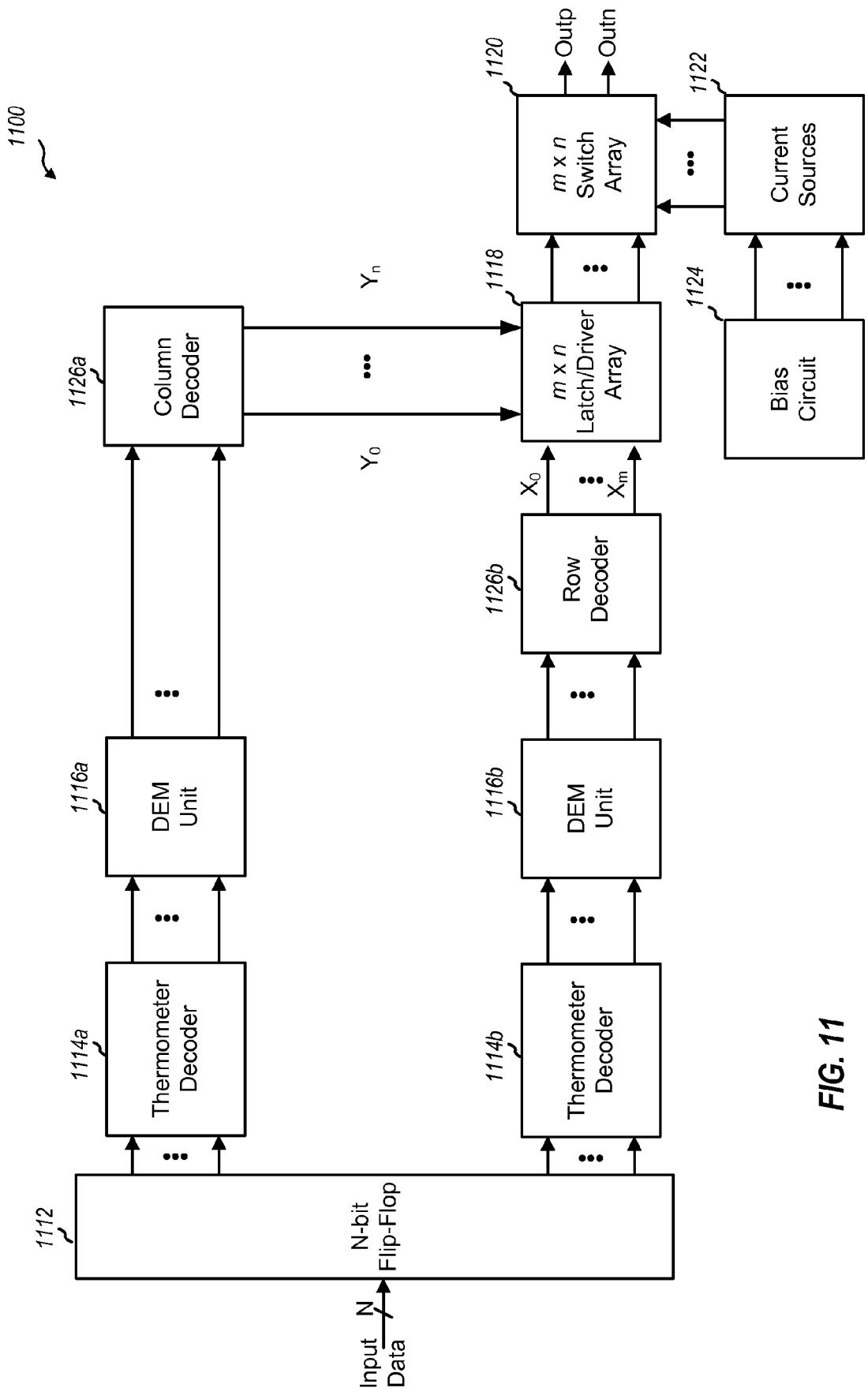
FIG. 11 shows a block diagram of a DAC according to an embodiment of the present invention.

FIG. 11 illustrates an example first circuit of a DAC implementing a DEM unit operating on a first portion of the input data to control the output of a two-dimensional array of switches according to an embodiment of the present invention. Within the illustrated first circuit of a DAC 1100, thermometer decoder 1114a and 1114b receive portions of the most significant bits M. For example, if N=12 and M=7, thermometer decoder 1114a may receive bits $D_{05}$ through $D_{08}$, and thermometer decoder 1114b may receive bits $D_{09}$ through $D_{11}$. Thermometer decoders 1114a and 1114b provide corresponding decoded signals to DEM units 1116a and 1116b, respectively. DEM units 1116a and 1116b receive their respective decoded signals, and provide select signals to a column decoder 1126a and a row decoder 1126b, respectively. DEM units 1116a and 1116b may be implemented with DEM unit 420 shown in FIGS. 4 through 6.

Column decoder 1126a decodes the received select signals into column select signals $Y_0$ through $Y_n$, which are used to assert a corresponding column in an m×n latch/driver array 1118. Similarly, row decoder 1126b decodes the received select signals into row select signals $X_0$ through $X_m$, which are used to assert a corresponding row in m×n latch/driver array 1118.

Latch/driver 1118 provides control signals for switches 1120 based on the asserted row and columns of its array. Switches 1120 receive reference currents of equal amount from current sources 1122. Each of the switches steers its reference current to either an Outp output or an Outn output based on its control signal. Latches 1118 ensure synchronous switching of the reference currents in order to reduce glitch energy in the Outp or Outn signals. A bias circuit 1124 generates a bias voltage for current sources 1122.

The multi-dimensional array of the partial DAC design shown in FIG. 11 has several potential advantages. For example, the separation into row and column DEM units increases the degree of randomization of the selected circuit elements. Also, by implementing the DEM units before the row and column decoding operations, circuit complexity is reduced. Accordingly, signal integration will be simpler and/or interface routing will be more straight forward The dynamic element selection techniques described herein may provide certain advantages. The techniques may be used to flexibly support different modes such as those given in Table 3. The techniques may also support various randomization schemes through flexibility in the design of the signal mapping circuit and the control circuit. Furthermore, the control circuit may be initialized to zero (for the bypass mode) or an arbitrary value (for the other modes), which avoids the need for special initialization circuitry such as the one required for the DWA design shown in FIG. 3A. The techniques may also generate less switching noise due to the use of fewer sequential logics, which may improve performance for sensitive analog circuits.

The above described DAC designs according to various embodiments of the present invention provide wideband, low spurious current advantages over the conventional art.

The techniques described herein may be used for various electronics devices such as wireless communication devices, handheld devices, gaming devices, computing devices, computers, laptop computers, consumer electronics devices, etc. An exemplary use of the techniques for a wireless communication device is described below.

Figure 12:
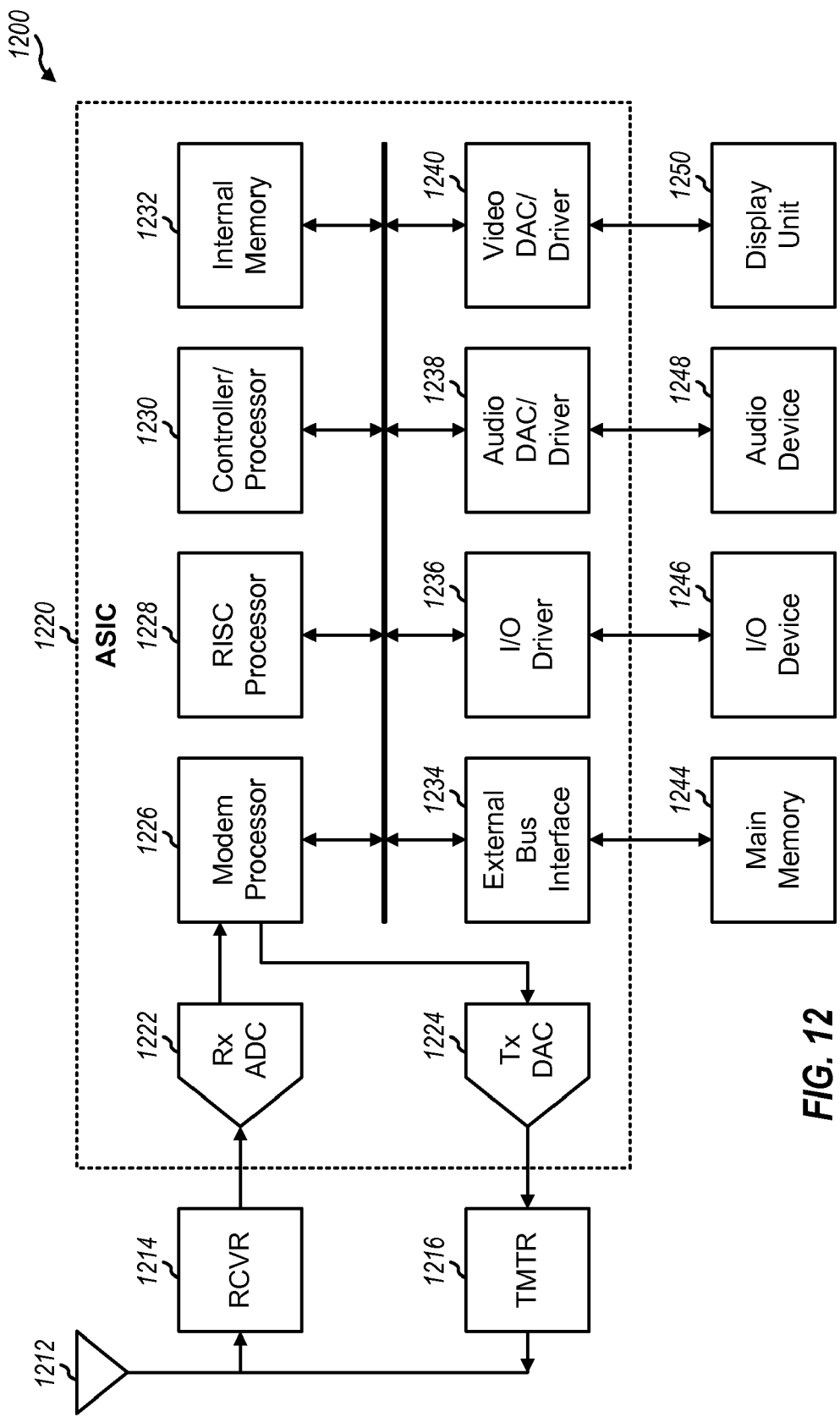
FIG. 12 shows a block diagram of a wireless communication device.

FIG. 12 shows a block diagram of a design of a wireless communication device 1200 in a wireless communication system. Wireless device 1200 may be a cellular phone, a terminal, a handset, a personal digital assistant (PDA), etc. The wireless communication system may be a Code Division Multiple Access (CDMA) system, a Global System for Mobile Communications (GSM) system, etc.

Wireless device 1200 is capable of providing bidirectional communication via a receive path and a transmit path. On the receive path, signals transmitted by base stations (not shown) are received by an antenna 1212 and provided to a receiver (RCVR) 1214. Receiver 1214 conditions the received signal and provides an analog input signal to an application specific integrated circuit (ASIC) 1220. On the transmit path, a transmitter (TMTR) 1216 receives and conditions an analog output signal from ASIC 1220 and generates a modulated signal, which is transmitted via antenna 1212 to the base stations.

ASIC 1220 may include various processing, interface, and memory units such as, e.g., a receive ADC (Rx ADC) 1222, a transmit DAC (Tx DAC) 1224, a modem processor 1226, a reduced instruction set computing (RISC) processor 1228, a controller/processor 1230, an internal memory 1232, an external bus interface 1234, an input/output (I/O) driver 1236, an audio DAC/driver 1238, and a video DAC/driver 1240. Rx ADC 1222 digitizes the analog input signal from receiver 1214 and provides samples to modem processor 1226. Tx DAC 1224 converts output chips from modem processor 1226 from digital to analog and provides the analog output signal to transmitter 1216. Modem processor 1226 performs processing for data transmission and reception, e.g., encoding, modulation, demodulation, decoding, etc. RISC processor 1228 may perform various types of processing for wireless device 1200, e.g., processing for video, graphics, higher layer applications, etc. Controller/processor 1230 may direct the operation of various processing and interface units within ASIC 1220. Internal memory 1232 stores data and/or instructions for various units within ASIC 1220.

EBI 1234 facilitates transfer of data between ASIC 1220 and a main memory 1244. I/O driver 1236 drives an I/O device 1246 via an analog or digital interface. Audio DAC/driver 1238 drives an audio device 1248, which may be a speaker, a headset, an earpiece, etc. Video DAC/driver 1240 drives a display unit 1250, which may be a liquid crystal display (LCD), etc. Rx ADC 1222, Tx DAC 1224, audio DAC/driver 1238, video DAC/driver 1240, and/or other units may implement the techniques described herein. For example, any of the DACs may be implemented as shown in FIGS. 9 through 11.

The techniques described herein may be implemented in various hardware units such as an integrated circuit (IC), an ASIC, a digital signal processor (DSP), a digital signal processing device (DSPD), a programmable logic device (PLD), a field programmable gate array (FPGA), a controller, a processor, and other electronic devices. The hardware units may be fabricated in various IC process technologies such as complementary metal oxide semiconductor (CMOS), N-channel MOS (NMOS), P-channel MOS (PMOS), bipolar-CMOS (Bi-CMOS), bipolar, etc. The hardware units may be fabricated with any device size technology, e.g., 130 nanometer (nm), 90 nm, 65 nm, 45 nm, 35 nm, etc.

The techniques described herein may be used for Tx DACs, ΣΔ DACs, audio DACs, video DACs, instrumentation DACs, Rx ADCs, ΣΔ ADCs, filters, etc. The DACs and ADCs may be implemented with P-FETs, N-FETs, bipolar junction transistors (BJTs), GaAs transistors, hetero-junction bipolar transistors (HBTs), high electron mobility transistors (HEMTs), etc. The DACs and ADCs may also be fabricated on various types of IC such as analog ICs, digital ICs, mixed signal ICs, radio frequency ICs (RFICs), etc.

While the foregoing disclosure shows illustrative embodiments of the invention, it should be noted that various changes and modifications could be made herein without departing from the scope of the invention as defined by the appended claims. The functions, steps and/or actions of the method claims in accordance with the embodiments of the invention described herein need not be performed in any particular order. Furthermore, although elements of the invention may be described or claimed in the singular, the plural is contemplated unless limitation to the singular is explicitly stated.

What is claimed is:

1. An apparatus, comprising:
    a first circuit to receive input data and provide a plurality of first signals asserted based on the input data;
    a second circuit to receive the plurality of first signals and provide a plurality of second signals used to select a plurality of circuit elements; and
    a third circuit to generate a control for the second circuit using a fractional data weight of the input data, the second circuit mapping the plurality of first signals to the plurality of second signals based on the control from the third circuit, wherein the third circuit comprises:
        a register to store a current value of the control;
        a data controller to receive the input data and to provide control data; and
        a summer to receive and sum the control data from the data controller and a current value of the control from the register, and to provide a new value of the control to the register.

2. The apparatus of claim 1, wherein the fractional data weight is a value between zero and the value of the input data, inclusive.

3. The apparatus of claim 2, wherein the fractional data weight is rounded up or down to the nearest whole number.

4. The apparatus of claim 3, wherein the fractional data weight is one-half of the input data rounded up or down to the nearest whole number.

5. The apparatus of claim 1, wherein the plurality of second signals selects the plurality of circuit elements in a sequential order.

6. The apparatus of claim 1, wherein the first circuit asserts a number of first signals based on the input data, and wherein the number of second signals asserted is equal to the number of first signals asserted.

7. The apparatus of claim 1, wherein the first circuit is configured to perform thermometer decoding on the input data and configured to provide thermometer decoded signals as the plurality of first signals.

8. The apparatus of claim 1, wherein the second circuit includes a plurality of multiplexers, each multiplexer configured to receive the plurality of first signals in a different order and configured to provide one of the plurality of second signals.

9. The apparatus of claim 8, wherein the plurality of multiplexers are configured to receive the control from the third circuit and to provide the plurality of first signals, circularly rotated by an amount determined by the control, as the plurality of second signals.

10. The apparatus of claim 9, wherein the plurality of first signals are circularly rotated by an amount equal to the value of the fractional data weight of the input data.

11. The apparatus of claim 1, wherein the control data is the fractional data weight of the input data.

12. The apparatus of claim 1, wherein the data controller further provides a carry-in to the summer to control rounding of the control data, and the summer is configured to sum the control data, the current value of the control, and the carry-in to provide the new value of the control to the register.

13. The apparatus of claim 12, wherein the data controller includes:
    a first logic device configured to generate the carry-in value as a '0' or the first bit of the input data based on a mode select signal indicating a desired rounding mode;
    a second logic device configured to generate a first bit of the control data as the second bit of the input data;
    a third logic device configured to generate a second bit of the control data as the third bit of the input data; and
    a fourth logic device configured to generate a third bit of the control data as a '0'.

14. The apparatus of claim 13, wherein the first through fourth logic devices are multiplexers.

15. An integrated circuit, comprising:
    a first circuit to receive input data and provide a plurality of first signals asserted based on the input data;
    a second circuit to receive the plurality of first signals and provide a plurality of second signals used to select a plurality of circuit elements; and
    a third circuit to generate a control for the second circuit using a fractional data weight of the input data, the second circuit mapping the plurality of first signals to the plurality of second signals based on the control from the third circuit, wherein the third circuit comprises:
        a register to store a current value of the control;
        a data controller to receive the input data and to provide control data; and
        a summer to receive and to sum the control data from the data controller and a current value of the control from the register, and to provide a new value of the control to the register, wherein the control data is the fractional data weight of the input data.

16. The integrated circuit of claim 15, wherein the fractional data weight is a value between zero and the value of the input data, inclusive, rounded up or down to the nearest whole number.

17. The integrated circuit of claim 15, wherein the first circuit is configured to perform thermometer decoding on the input data and provides thermometer decoded signals as the plurality of first signals.

18. The integrated circuit of claim 15, wherein the second circuit further comprises:
a plurality of multiplexers to receive the control from the third circuit and to provide the plurality of first signals, circularly rotated by an amount equal to the value of the fractional data weight of the input data, as the plurality of second signals.

19. The integrated circuit of claim 15, wherein the data controller is further configured to provide a carry-in to the summer to control rounding of the control data, and the summer sums the control data, the current value of the control, and the carry-in to provide the new value of the control to the register.

20. A method, comprising:
asserting zero or more of a plurality of first signals based on input data;
generating a control using a fractional data weight of the input data;
mapping the plurality of first signals to a plurality of second signals based on the control, wherein mapping the plurality of first signals to the plurality of second signals comprises providing the plurality of first signals, circularly rotated by an amount equal to the fractional data weight of the input data, as the plurality of second signals; and
selecting zero or more of a plurality of circuit elements based on the plurality of second signals.

21. The method of claim 20, further comprising:
providing the fractional data weight as a value between zero and the value of the input data, inclusive, rounded up or down to the nearest whole number.

22. The method of claim 20, wherein the asserting zero or more of the plurality of first signals includes asserting zero or more of the plurality of first signals based on thermometer decoding of the input data.

23. The method of claim 20, further comprising:
accumulating a current value of the control with the fractional data weight of the input data to obtain a new value of the control.

24. An apparatus, comprising:
means for asserting zero or more of a plurality of first signals based on input data;
means for generating a control using a fractional data weight of the input data;
means for mapping the plurality of first signals to a plurality of second signals based on the control, wherein the means for mapping the plurality of first signals to the plurality of second signals is configured to provide the plurality of first signals, circularly rotated by an amount equal to the fractional data weight of the input data, as the plurality of second signals; and
means for selecting zero or more of a plurality of circuit elements based on the plurality of second signals.

25. The apparatus of claim 24, further comprising:
means for providing the fractional data weight as a value between zero and the value of the input data, inclusive, rounded up or down to the nearest whole number.

26. The apparatus of claim 24, wherein the means for asserting zero or more of the plurality of first signals is configured to assert zero or more of the plurality of first signals based on thermometer decoding of the input data.

27. The apparatus of claim 24, further comprising:
means for accumulating a current value of the control with the fractional data weight of the input data to obtain a new value of the control.

28. A digital-to-analog converter (DAC) for converting digital input data to an analog output signal, the DAC comprising:
a first plurality of circuit elements of equal size configured to generate the analog output signal;
a first thermometer decoder to receive at least a first portion of the digital input data and to provide a plurality of first signals; and
a first dynamic element matching (DEM) unit to receive the plurality of first signals and to provide a plurality of second signals used to select the first plurality of circuit elements, the first DEM unit mapping the plurality of first signals to the plurality of second signals based on a fractional data weight of the at least first portion of the digital input data, wherein the first DEM unit comprises:
a plurality of multiplexers, each multiplexer configured to receive the plurality of first signals in a different order and configured to provide one of the plurality of second signals; and
a control circuit to generate a control for the plurality of multiplexers based on the fractional data weight of the at least a first portion of the digital input data.

29. The DAC of claim 28, wherein the control circuit accumulates the fractional data weight of the at least a first portion of the digital input data with a current value of the control to obtain a new value of the control.

30. The DAC of claim 28, wherein the first plurality of circuit elements includes a plurality of current sources to provide equal amount of current.

31. The DAC of claim 28, wherein the first plurality of circuit elements includes a plurality of capacitors of equal size.

32. The DAC of claim 28, further comprising:
a second plurality of circuit elements of equal size configured to generate the analog output signal; and
a second thermometer decoder to receive a second portion of the digital input data and to provide a plurality of third signals used to select the second plurality of circuit elements, the first and second portions of the digital input data being non-overlapping and each including at least one bit of the digital input data.

33. The DAC of claim 32, wherein the second plurality of circuit elements includes a plurality of current sources to provide equal amount of current.

34. The DAC of claim 32, wherein the second plurality of circuit elements includes a plurality of capacitors of equal size.

35. The DAC of claim 28, further comprising:
a second plurality of circuit elements of equal size configured to generate the analog output signal; and
a second thermometer decoder to receive a second portion of the digital input data and to provide a plurality of third signals, the first and second portions of the digital input data being non-overlapping and each including at least one bit of the digital input data; and
a second DEM unit to receive the plurality of third signals and to provide a plurality of fourth signals used to select the second plurality of circuit elements, the second DEM unit configured to map the plurality of third signals to the plurality of fourth signals based on a fractional data weight of the second portion of the digital input data.

36. The DAC of claim 35, wherein the second DEM unit includes:
a plurality of multiplexers, each multiplexer configured to receive the plurality of third signals in a different order and to provide one of the plurality of fourth signals; and
a control circuit to generate a control for the plurality of multiplexers based on the fractional data weight of the second portion of the digital input data.

37. The DAC of claim 36, wherein the control circuit accumulates the fractional data weight of the second portion of the digital input data with a current value of the control to obtain a new value of the control.

38. The DAC of claim 35, wherein the second plurality of circuit elements includes a plurality of current sources providing equal amount of current.

39. The DAC of claim 35, wherein the second plurality of circuit elements includes a plurality of capacitors of equal size.

40. The DAC of claim 35, further comprising:
an circuit element array including the first and second plurality of circuit elements, the circuit element array configured to generate the analog output signal;
a column decoder to generate a plurality of fifth signals used to select a column of the circuit element array based on one of the plurality of second or fourth signals; and
a row decoder to generate a plurality of sixth signals used to select a row of the circuit element array based on the other of the plurality of second or fourth signals.

* * * * *